(12) United States Patent
Gollakota et al.

(10) Patent No.: US 11,159,059 B2
(45) Date of Patent: Oct. 26, 2021

(54) SYSTEMS AND METHODS FOR WIRELESS POWER TRANSMISSION

(71) Applicant: University of Washington, Seattle, WA (US)

(72) Inventors: Shyamnath Gollakota, Seattle, WA (US); Vikram Subramaniam Iyer, Seattle, WA (US); Arka Majumdar, Seattle, WA (US); Elyas Bayati, Seattle, WA (US); Rajalakshmi Nandakumar, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 16/691,202

(22) Filed: Nov. 21, 2019

(65) Prior Publication Data

US 2020/0161904 A1 May 21, 2020

Related U.S. Application Data

(60) Provisional application No. 62/770,325, filed on Nov. 21, 2018.

(51) Int. Cl.
*H02J 50/30* (2016.01)
*H02J 50/80* (2016.01)
(Continued)

(52) U.S. Cl.
CPC .............. *H02J 50/30* (2016.02); *H02J 50/80* (2016.02); *H02J 50/90* (2016.02); *H01L 35/02* (2013.01); *H02J 7/025* (2013.01)

(58) Field of Classification Search
CPC .. H02J 50/30; H02J 50/80; H02J 50/90; H02J 7/025; H02J 7/02; H02J 5/005;
(Continued)

(56) References Cited

U.S. PATENT DOCUMENTS 9,894,531 B2 2/2018 Li et al.
2006/0266917 A1 11/2006 Baldis et al.
(Continued)

FOREIGN PATENT DOCUMENTS

WO 2017158605 A1 9/2017
WO 2017205549 A2 11/2017
WO 2017214611 A1 12/2017

OTHER PUBLICATIONS

"BGA Heat Sink—High Performance Ultra Low Profile" Advanced Thermal Solutions, 1995. URL: https://www.digikey.com/product-detail/en/advanced-thermal-solutions-inc/ATS-60000-C1-R0/ATS1376-ND/1285090.
(Continued)

*Primary Examiner* — John W Poos
*Assistant Examiner* — Alex W Lam
(74) *Attorney, Agent, or Firm* — Perkins Coie LLP

(57) ABSTRACT

Systems and methods for wirelessly transmitting power across a room or space are disclosed herein. One such system is comprised of a power receiving element positioned to receive wireless power transfer, comprised of a power receiving cell and a retroreflector positioned proximate the power receiving cell, and a power transmission element configured to wirelessly transmit power towards the power receiving element. The power transmission element includes an optical power transmitter configured to emit a first laser beam with a first power density towards the receiving cell, a guard beam emitter positioned proximate the optical power transmitter and configured to emit a second laser beam with a second power density towards the retroreflectors, a light detector positioned proximate the guard beam emitter and configured to detect light reflected by the retroreflectors, and an interlock system configured to
(Continued)

interrupt power transmission when a decrease in light incident from the retroreflectors is detected.

11 Claims, 9 Drawing Sheets

(51) Int. Cl.
  *H02J 50/90* (2016.01)
  *H01L 35/02* (2006.01)
  *H02J 7/02* (2016.01)
(58) Field of Classification Search
  CPC ......... H01L 35/02; G01S 1/024; G01S 15/02; H04B 10/807; G02F 1/11
  See application file for complete search history.

(56) References Cited

U.S. PATENT DOCUMENTS

| | | | |
|---|---|---|---|
| 2009/0102296 A1 | 4/2009 | Greene et al. | |
| 2018/0136364 A1 | 5/2018 | Kare et al. | |
| 2018/0248399 A1* | 8/2018 | Moghaddam | H02J 50/80 |
| 2019/0334389 A1* | 10/2019 | Kim | H02J 50/30 |

OTHER PUBLICATIONS

"Electret Condenser Microphone" Sony, 2011. URL: https://images-na.ssl-images-amazon.com/images/I/714s6fjypPS.pdf.
Power MOSFET 12 Amps, 60 Volts. ON Semiconductor, Nov. 2000, Rev. 4, pp. 1-8.
Achtelik et al., "Design of a Flexible High Performance Quadcopter Platform Breaking the MAV Endurance Record with Laser Power Beaming" 2011 IEEE/RSJ International Conference on Intelligent Robots and Systems, Sep. 25-30, 2011, p. 5166-5172.
Adafruit. 2017. Laser diode—Red. URL: https://www.adafruit.com/product/1054.
Arbabi et al., "Planar Retroreflector" Optical Society of America, CLEO:2014, STu3M.5.
Buettner et al., "Demo Abstract: RFID Sensor Networks with the Intel WISP" In Proceedings of the 6th ACM Conference on Embedded Network Sensor Systems (SenSys '08), p. 393-394.
Chabalko et al., "Quasistatic Cavity Resonance for Ubiquitous Wireless Power Transfer" PLOS One 12, 2 (Feb. 2017), 1-14.
Clark et al., "Towards Autonomously-Powered CRFIDs" Workshop on Power Aware Computing and Systems (HotPower '09), Oct. 2009.
Ding et al., "Application of smart antenna technologies in simultaneous wireless information and power transfer" IEEE Communications Magazine, vol. 53, No. 4, pp. 86-93, Apr. 2015.
Fareq et al., "Solar wireless power transfer using inductive coupling for mobile phone charger" IEEE 8th International Power Engineering and Optimization Conference (PEOCO2014), Langkawi, 2014, pp. 473-476.
Ghobadi et al., "ProjecTOR: Agile Reconfigurable Data Center Interconnect" In Proceedings of the 2016 ACM SIGCOMM Conference (SIGCOMM '16). ACM, New York, NY, USA, 216-229.
Griffin et al., "Resonant wireless power transfer to ground sensors from a UAV. In Robotics and Automation (ICRA)" 2012 IEEE International Conference on. IEEE, 2660-2665.
Harold E. Bennett, "DOD and Navy applications for laser power beaming," Proc. SPIE 2376, Laser Power Beaming II, (Apr. 26, 1995); doi: 10.1117/12.208217.
Hoffert et al., "Power Beaming for Space-Based Electricity on Earth: Near-Term Experiments with Radars, Lasers and Satellites" In Solar Power from Space-SPS'04, vol. 567. 195.
Hoflinger et al., "Acoustic Self-calibrating System for Indoor Smartphone Tracking (ASSIST)," 2012 International Conference on Indoor Positioning and Indoor Navigation (IPIN), Sydney, NSW, 2012, pp. 1-9.

IEC 60825-1, "Safety of Laser Products" International Electrotechnical Commission, 2001.
IEC 60950-1, "Information Technology Equipment Safety" International Electrotechnical Commission, 2005.
Kurs et al., "Wireless Power Transfer via Strongly Coupled Magnetic Resonances" Science 317, 5834 (2007), 83-86.
Lee et al., "Integrated guided wave generation and sensing using a single laser source and optical fibers" Measurement Science and Technology 21, 10 (2010), 105-207.
Lin, James C. "A new IEEE standard for safety levels with respect to human exposure to radio-frequency radiation" IEEE Antennas and Propagation Magazine 48, 1 (2006), 157-159.
Liu et al., "Ambient Backscatter: Wireless Communication out of Thin Air" In Proceedings of the ACM SIGCOMM 2013 Conference on SIGCOMM (SIGCOMM '13). ACM, New York, NY, USA, 39-50.
Liu et al., "AutoCharge: Automatically Charge Smartphones Using a Light Beam" Microsoft Research, 2015.
Liu et al., "Charging Unplugged: Will Distributed Laser Charging for Mobile Wireless Power Transfer Work?" IEEE Vehicular Technology Magazine 11, 4 (Dec. 2016), 36-45.
Liu et al., "Will Distributed Laser Charging for Mobile Wireless Power Transfer Work?" IEEE Vehicular Technology Magazine, vol. 11, No. 4, pp. 36-45, Dec. 2016.
Meadowlark Optics, High Contrast Optical Shutter, 2017. URL: http://www.meadowlark.com/store/data_sheet/opticalshutter.pdf.
Menon et al., "Efficient wireless power transfer using underground relay coils. In Computing" Communication and Networking Technologies (ICCCNT), 2014 International Conference on. IEEE, 1-5.
Mukherjee et al., "Demonstration of eye-safe (1550 nm) terrestrial laser power beaming at 30 m and subsequent conversion into electrical power using dedicated photovoltaics" In 2013 IEEE 39th Photovoltaic Specialists Conference (PVSC). 1074-1076.
Nandakumar et al., "FingerIO: Using Active Sonar for Fine-Grained Finger Tracking". In Proceedings of the 2016 CHI Conference on Human Factors in Computing Systems (CHI '16). ACM, New York, NY, 1515-1525.
NASA Facts, "Beamed Laser Power for UAVs", 2004.
Nayfeh et al., "High intensity laser power beaming architecture for space and terrestrial missions". URL: https://ntrs.nasa.gov/search.jsp?R=20110009990.
Nugent et al., "Laser power beaming for defense and security applications" SPIE, 2011, 804514-804514—8 pages.
Parks et al., "Turbocharging Ambient Backscatter Communication" In Proceedings of the 2014 ACM Conference on SIGCOMM (SIGCOMM '14). ACM, New York, NY, USA, 619-630.
PCO-6141 Fixed Pulsed/CW Laser Diode Driver Module, IXYS Colorado.
Plastic Photodiode Packages with Leads, API Advance Photonix, Inc. PDB-C156. URL: http://advancedphotonix.com/wp-content/uploads/PDB-C156.pdf.
Raavi et al., "An optical wireless power transfer system for rapid charging" In 2013 Texas Symposium on Wireless and Microwave Circuits and Systems (WMCS) pp. 1-4.
Sahai et al., "Optical wireless power transmission at long wavelengths" In 2011 International Conference on Space Optical Systems and Applications (ICSOS). 164-170.
Seeed Studios, 0.5w Solar Panel 55*70, URL: http://wiki.seeedstudio.com/index.php?title=0.5w_Solar_Panel_55*70.
Smagowska et al., "Effects of ultrasonic noise on the human body—a bibliographic review" International Journal of Occupational Safety and Ergonomics 19, 2 (2013), 195-202.
Steinsiek et al., "Wireless power transmission experiment using an airship as relay system and a moveable rover as ground target for later planetary exploration missions" In 8th ESA Workshop on Advanced Space Technologies for Robotics and Automation. 1-10.
Summerer et al., "Concepts for Wireless Energy Transmission via Laser" Europeans Space Agency (ESA)—Advanced Concepts Team (2009).
Talla et al., "Powering the Next Billion Devices with Wi-Fi." In Proceedings of the 11th ACM Conference on Emerging Networking Experiments and Technologies (CoNEXT '15). ACM, New York, NY, USA, Article 4, 13 pages.

(56) References Cited

OTHER PUBLICATIONS

Thermoelectric Cooler, Hebei I.T. (Shanghai) Co., Ltd. 2001. TEC1-12706. URL: http://peltiermodules.com/peltier.datasheet/TEC1-12706.pdf.
Universal Serial Bus Specification, USB Implementers Forum, 2004. URL: http://www.usb.org/developers/docs/usb20_docs/.
Wireless Charging 2.0, Energous, 2017. URL: http://energous.com/.
Wireless Power Solutions for Robotic Systems, WiBotic, 2017. URL: http://www.wibotic.com/.
Wireless Power Technology that Will Change the World for Consumer Electronics, Ossia Inc., 2017. URL: http://www.ossia.com.

\* cited by examiner

SYSTEMS AND METHODS FOR WIRELESS POWER TRANSMISSION

CROSS-REFERENCE TO RELATED APPLICATION(S)

The present application claims priority to U.S. Provisional Patent Application No. 62/770,325 filed Nov. 21, 2018, the disclosure of which is incorporated by reference in its entirety.

TECHNICAL FIELD

The present technology is generally related to systems and methods for wirelessly transmitting power across a room or space and, more specifically, to wireless power transmission using a high-power laser beam with an incorporated laser detection system to prevent unintended object exposure to the beam.

BACKGROUND

Wireless access has become a fundamental part of daily life with the growing ubiquity of smartphones and electronic devices all around us. While wireless communication techniques have partly untethered devices, wireless power transfer has been slower to catch up. Wireless power transfer—also called wireless power transmission, wireless energy transmission, or electromagnetic power transfer—is the transmission of electrical energy without wires as a physical link. In a wireless power transmission system, a transmitter device delivers power across some amount of space to a receiver device via an electromagnetic field rather than through a wired connection. Wireless power transmission can eliminate the need to use wires or special power adaptors, helping to free electronic devices for more convenient use in our everyday lives. Wireless power transmission also allows for further development and use of devices adapted for use without batteries. Moreover, wireless power transfer is useful for powering electrical devices where interconnecting wires are inconvenient, hazardous, and/or are not possible.

BRIEF DESCRIPTION OF THE DRAWINGS

Many aspects of the present technology can be better understood with reference to the following drawings. The components in the drawings are not necessarily drawn to scale. Instead, emphasis is placed on illustrating clearly the principles of the present technology. Furthermore, components can be shown as transparent in certain views for clarity of illustration only and not to indicate that the component is necessarily transparent. Components may also be shown schematically

Figure 1A:
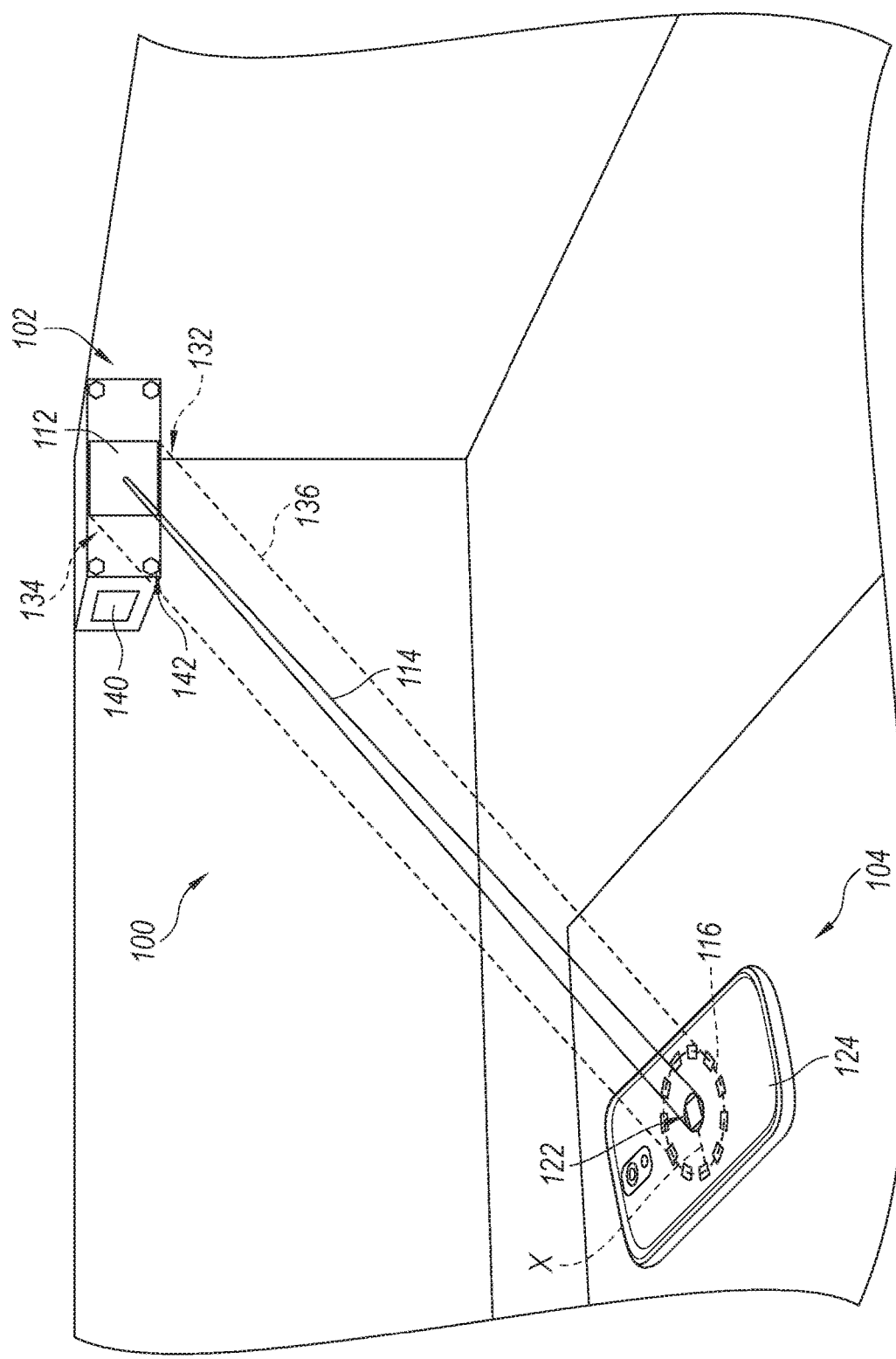
FIG. 1A is a partially schematic view of a wireless power transmission system configured in accordance with various embodiments of the present technology.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments.

DETAILED DESCRIPTION

The present technology is directed to systems and methods for wirelessly transmitting power across a room or space using a high-power laser beam with an incorporated object detection system to prevent unintended exposure to the beam. The disclosed technology also includes components that allow for rapid location/targeting of the power-receiving side using acoustic locator(s) and/or optical scanning. Systems configured in accordance with the present technology can include, for example, an optical power transmitter configured to emit a first laser beam with a first power density toward a power receiving element. The system can also include a guard beam emitter positioned proximate the optical power transmitter and configured to emit a second laser beam with a second, lower power density toward a retroreflector positioned proximate the power receiving cell and configured to reflect the second laser beam to a light detector positioned proximate the guard beam emitter. The light detector can be coupled to an interlock system that is configured to interrupt emission of the first laser beam whenever the light detectors detect a decrease in incident light from the retroreflector. Further details regarding systems and methods for wirelessly transmitting power in accordance with the present technology are described below.

A. Overview

Wireless power techniques fall into two broad categories, near field and far-field. In near field, power is transferred over short distances by magnetic fields using inductive coupling between coils of wire, or by electric fields using capacitive coupling between metal electrodes. In far-field, power is transferred by electromagnetic radiation, such as though RF fields, microwaves, laser beams, etc.

Recent advances in near-field wireless charging techniques have begun to gain traction for certain range-limited applications including cars, drones, and cell phone charging mats. While these techniques are generally safe for human exposure, they require the receiver to be in close proximity with the power source and/or transmitter. For example, magnetic induction techniques can only operate efficiently at distances on the order of the coil's diameter, limiting the distance power can be transmitted to a range of tens of centimeters in practice.

Far field techniques, in contrast, can transport energy longer distances, but generally introduce significant concerns with human exposure and also generally must be aimed at the receiver. Far field radio-frequency (RF) signals (such as Wi-Fi, TV signals, etc.) are one exception to these limitations. They allow power to be harvested from broadly distributed signals that are generally safe for human exposure. However, power harvesting from RF signals is limited to ultra-low power applications (on the order of milliwatts) mostly due to the power of the fields being harvested. Increasing the power in those fields would lead to significant concerns about constant human exposure to high-power electromagnetic fields.

Microwave power transmission offers one alternative, allowing for higher power transmission in a more concentrated environment. However, microwave transmissions tend to disrupt existing communications signals, such as Wi-Fi or cellular service, even when transmitting power on different frequency channels, making this technique unattractive for transmitting power to personal electronic devices even before the safety concerns are considered.

Laser-based power transmission systems have received some attention for their potential to transmit power across distances to receivers, such as photovoltaic cells, without disrupting the existing signal environment. Such conventional systems, however, come with significant concerns. For example, using a laser in the visible to near infra-red range (wavelengths of 350 to 2500 nm—the most efficient for power transfer) to deliver 1 W of power to a 1 cm$^2$ requires a power density greater than 4.3 W/cm$^2$. At this power level, the laser can cause damage to an eye or other human tissue after only 10 µs of exposure. Further, to allow broad implementation, such systems require precise aiming at receivers that may not be stationary (e.g., mobile device, battery-free drone, etc.).

One conventional approach to address these limitations is to use a beam wavelength that is safe for human exposure, even at high power levels. Such beams wavelengths, however, result in much less efficient power harvesting at the receiver, and often require expensive components. Another approach is to only utilize wireless power transmission in situations where human exposure is extremely unlikely, such as transmitting power to satellites or in controlled, remote environments. Such approaches, however, are costly and often inefficient and cumbersome.

In contrast with conventional wireless power transfer systems, the present technology is directed to a wireless power transmission system that operates in the visible and near-IR wavelength range and includes features expected to inhibit humans or other unintended objects from coming into contact with a high-power laser beam (e.g. a first laser beam with a high power density). Specifically, some embodiments of the present technology include a laser detection system configured to create a low-power curtain around the high-power laser beam and detect when an object is approaching the high-power laser beam. The laser detection system may include, for example, at least one low-power laser beam emitter for emitting guard beam(s) (e.g. a second laser beam with a lower power density), near an emission point for the high-power laser beam. Each guard beam is incident on an array of retroreflectors located around the power receiver and redirected back to the emission point, where it is detected by an array of light detectors. In some embodiments, the laser detection system comprises an array of guard beams such that there is one guard beam per light detector. In this arrangement, an object interrupting the beam's path will cause a discrete decrease the light incident on a light detector, allowing for rapid, accurate detection of an object before exposure to the high-power laser beam.

Further, the laser detection system is expected to prevent any object from inadvertently entering the power supply path by positioning the low-powered beams at least a predetermined distance X circumferentially away from the high-power laser beam, where X is the distance an object could travel in the time it takes to interrupt (e.g., block, redirect, power down, cut off, etc.) the high-power laser beam. In one embodiment, for example, an interlock system configured to shut off the high-power laser beam when the path of a guard beam is obstructed requires 272 µs to turn off the high-power laser beam. If the maximum speed used is 44 m/s (i.e., the maximum speed of an arm in professional sports), the laser detection scheme requires the distance X be 1.20 cm to ensure no exposure is possible—distance given by the time-to-shut off multiplied by the speed of the object. In other embodiments, the distance X may be less than 1.5 cm. In still other embodiments, the distance X may have a different value.

The present technology can further include components and associated methods for quickly locating the power receiver device and aiming the laser beam in the correct direction. In some embodiments, for example, systems configured in accordance with the present technology include an acoustic locator system in combination with a scanning mechanism using the low-powered beams of the laser detection system. During operation of the acoustic locator system, the power receiving side emits acoustic waves, preferably pitched out of the audible range, and the timing of the wave's arrival is measured at known points using acoustic detectors. An algorithm can be used to calculate a coarse location of the power receiving element based on the measured arrival times, and the coarse location can be used to direct guard beams to scan for the power receiving element. Scanning can be accomplished, for example, via the use of pivotable mirrors in the laser detection system, mechanically adjusting the output orientation of the guard beam emitters, or various other suitable methods known to those of skill in the art. In one embodiment, the acoustic location process happens continuously as the receiver is moved (e.g. when a personal electronic device is picked up and set back down), allowing for real-time, or near real-time, tracking to improve the speed of the charging process. In other embodiments, however, the acoustic locator system may operate differently relative to operation of the high-power laser beam and/or may have a different configuration.

The terminology used in the description presented herein is intended to be interpreted in its broadest reasonable manner, even though it is being used in conjunction with a detailed description of certain specific embodiments of the present technology. Certain terms may even be emphasized below; however, any terminology intended to be interpreted in any restricted manner will be overtly and specifically defined as such in this Detailed Description section. Additionally, the present technology can include other embodiments that are within the scope of the claims but are not described in detail with respect to FIGS. 1-5.

Reference throughout this specification to "one embodiment" or "an embodiment" means that a particular feature, structure or characteristic described in connection with the embodiment is included in at least one embodiment of the present technology. Thus, the appearances of the phrases "in one embodiment" or "in an embodiment" in various places throughout this specification are not necessarily all referring to the same embodiment.

Furthermore, the particular features or characteristics may be combined in any suitable manner in one or more embodiments.

Reference throughout this specification to relative terms such as, for example, "substantially," "approximately," and "about" are used herein to mean the stated value plus or minus 10%. The headings provided herein are for convenience only and do not interpret the scope or meaning of the claimed present technology.

B. Embodiments of Wireless Power Transmission Systems and Associated Methods

Figure 1B:
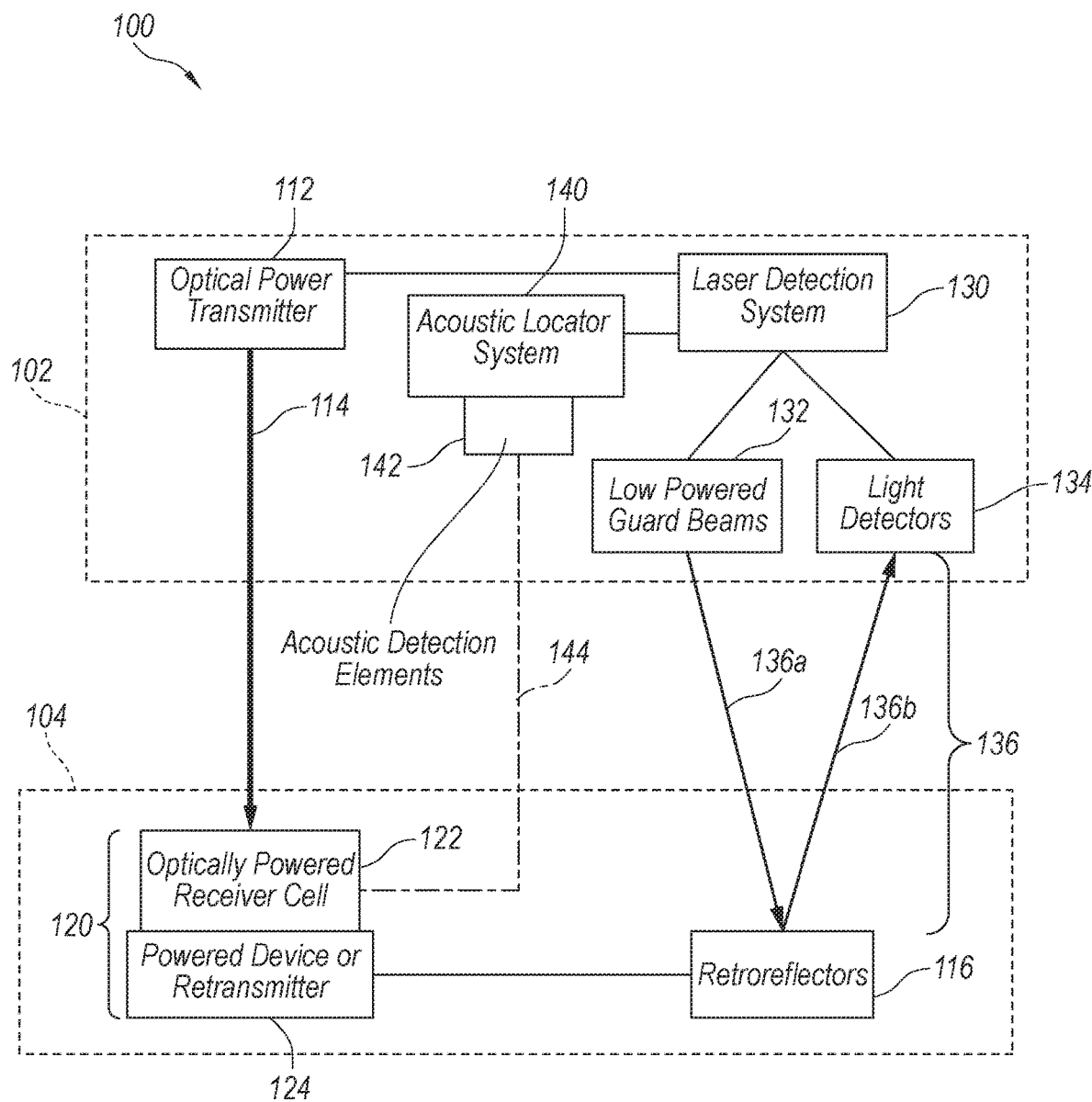
FIG. 1B is a block diagram the power transmission system of FIG. 1A.

FIG. 1A is a partially schematic diagram of a wireless power transmission system 100 (the "system 100") configured in accordance with various embodiments of the present technology, and FIG. 1B is a block diagram of the system 100. Referring to FIGS. 1A and 1B together, the system 100 comprises a power transmission side 102 adapted to wirelessly deliver power, and a power receiving side 104 adapted to receive, store, and/or retransmit such power. In the illustrated embodiment, the power transmission side 102 of the system 100 includes an optical power transmitter 112 configured to aim and transmit a high-power laser beam 114 toward a power receiving element 120 at the power receiving side 104. The power receiving element 120 is comprised of an optically powered receiving cell 122 (e.g., a photovoltaic cell) and a power-storing element 124 (e.g., a personal electronic device or a retransmitting device) in electrical communication with the powered receiving cell 122. The power receiving side 104 also includes and an array of retroreflectors 116 configured for use with a laser detection system 130 at the power transmission side 102.

The laser detection system 130 is comprised of at least one guard beam emitter 132 and an array of light detectors 134, such as photodiodes. In the illustrated embodiment, the laser detection system 130 comprises an array of guard beam emitters 132 emitting an array of guard beams 136 such that there is one guard beam 136 per light detector 134. The guard beam emitters 132 are configured to emit low-powered guard beams 136 toward the array of retroreflectors 116; the retroreflectors 116 are configured to reflect corresponding guard beams 136 back towards the array of light detectors 134; and the light detectors 134 are configured to receive the reflected guard beam 136. As best seen in FIG. 1B, for example, the guard beams 136 extend in a first path 136a from the guard beam emitters 132 to the retroreflectors 116; then a second path 136b in the generally opposite direction, from the retroreflectors 116 to the light detectors 134. Whenever one of the guard beam paths 136a/136b is obstructed, the amount of light incident on the light detectors 134 will drop, allowing the laser detection system 130 to detect the obstruction. Because the guard beams 136 propagate at the speed of light, the light detectors 134 can detect the interruption in a relatively short amount of time. For example, if the power transmitter is contained in a 30 m×30 m room, the detection can occur on the order of tens of nanoseconds. The laser detection system 130 further comprises a power switch (not shown), such as an interlock system, configured to cut off the optical power transmitter 112 whenever the laser detection system 130 detects an obstruction in one of the guard beam paths 136a and 136b. In one embodiment, for example, the power switch is an interlock that turns off the power to the optical power transmitter 112 whenever a path-obstructing object is detected.

In some embodiments, the optical power transmitter 112 is further configured to adjust an amount of power being transmitted (increase and/or decrease the power) based, at least in part, on the type of device or retransmitter is receiving power. This adjustment, for example, can be initiated by a signal from the power receiving element 120, the laser detection system 130, and/or an input from a user.

In the embodiment shown in FIGS. 1A and 1B, the system 100 also includes an acoustic locator system 140 that can be used to quickly and accurately locate the power receiving element 120. The acoustic locator system 140 may be positioned at or near the power transmission side of the system or, in other embodiments, the acoustic locator system 140 may have a different position relative to the other system components. The acoustic locator system 140 includes an array of acoustic detection elements 142 (e.g., microphones) configured to detect and record the time of arrival of acoustic emissions 144 emitted by the power receiving element 120, e.g. using a speaker. In preferred embodiments, the array of acoustic detection elements 142 is comprised of at three or more acoustic detection elements 142. By recording the difference between the time of arrival of the acoustic waves at the or more acoustic detection elements 142, the acoustic locator system 140 can locate a position of the power receiving element 120 at a coarse level using various well-known multilateralization techniques, discussed below with respect to FIG. 4. As further shown in FIG. 1B, in some embodiments the acoustic locator system 140 may be operably coupled to the laser detection system 130 and operate cooperatively when locating the power receiving element 120.

Figure 2A:
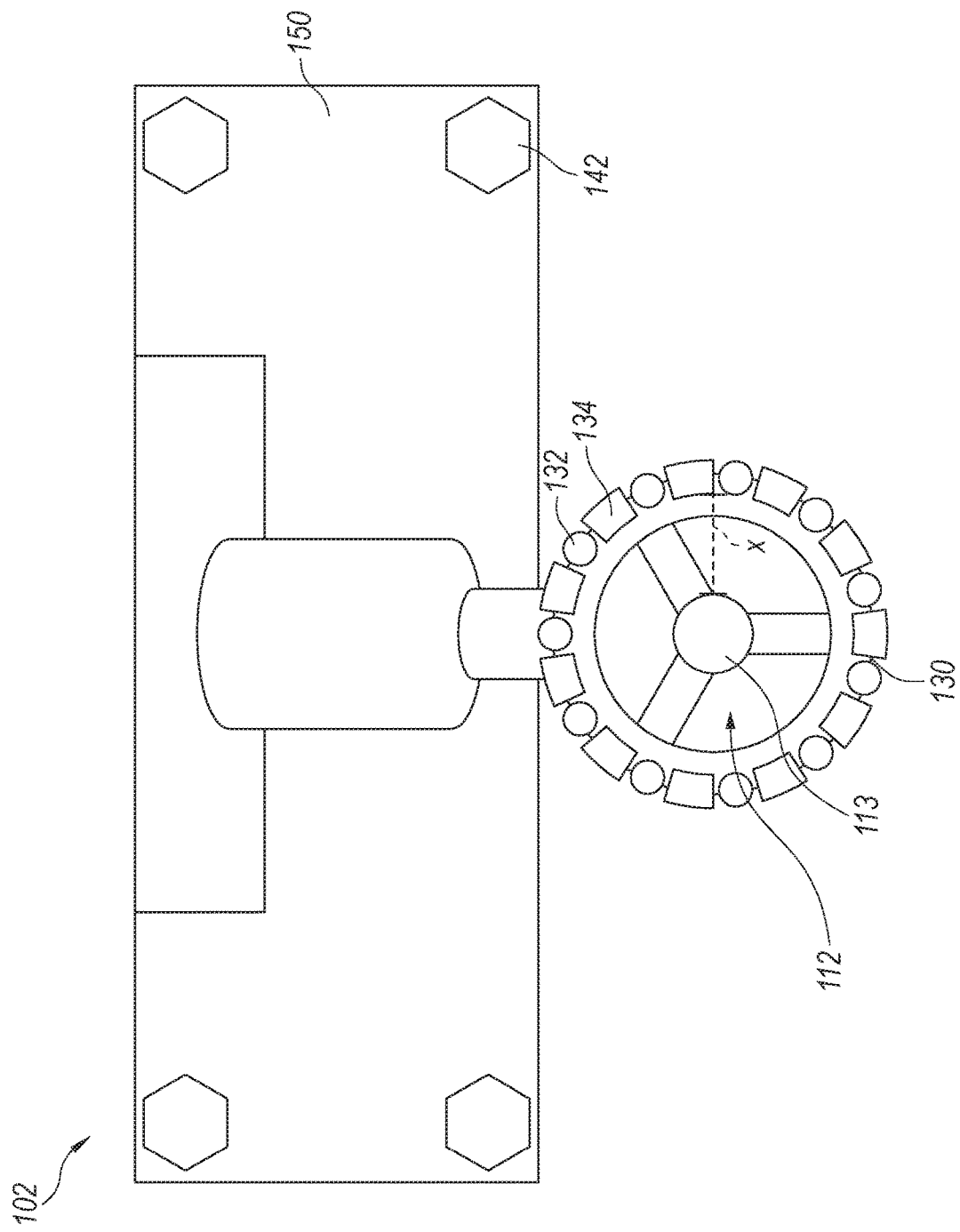
FIG. 2A is a partially schematic front view of the power transmission side of the system of FIG. 1A configured in accordance with various embodiments of the present technology.
Figure 2B:
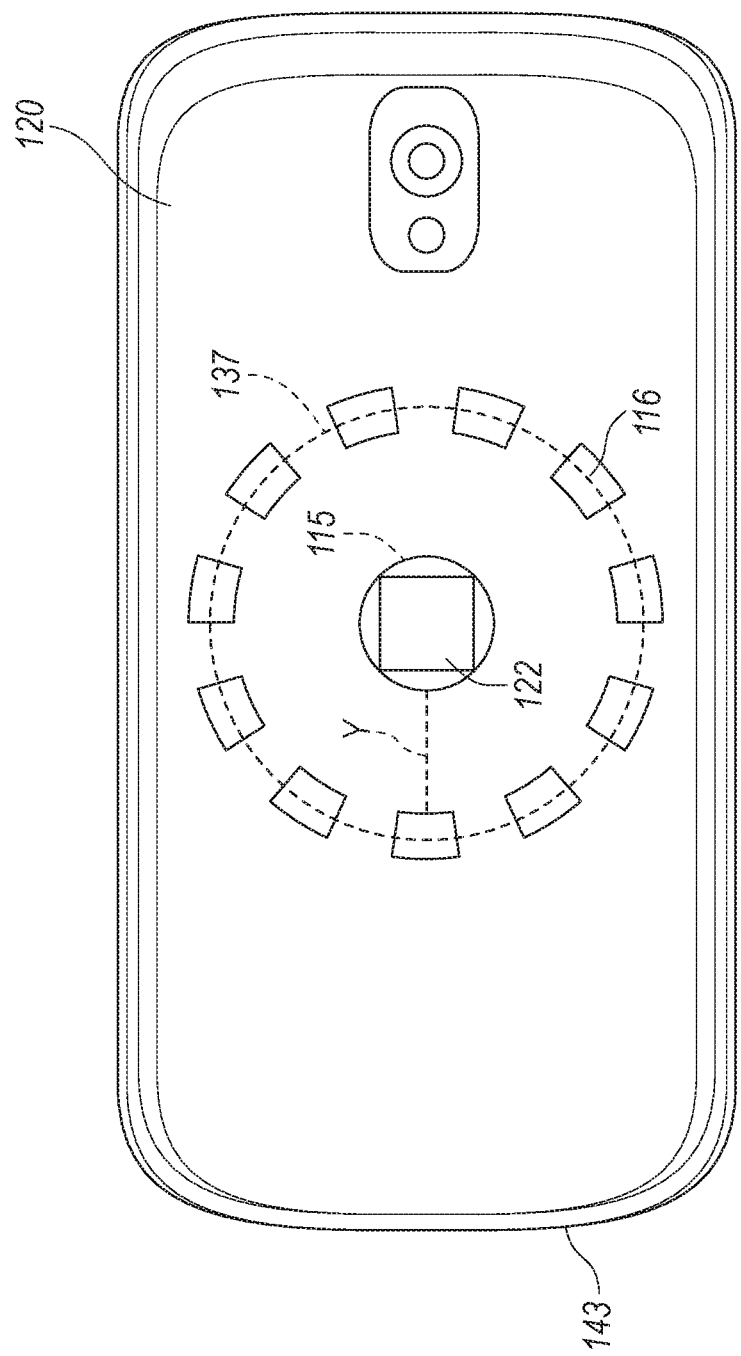
FIG. 2B is a partially schematic top view of the power receiving side of the system of FIG. 1A configured in accordance with various embodiments of the present technology.

FIG. 2A is a front facing schematic diagram of the power transmission side 102 configured in accordance with one embodiment of the present technology, and provides a representative diagram of one possible layout of the power transmission side 102 of the system 100. FIG. 2B is a schematic diagram of a top view of the power receiving side 102, providing an illustration of one possible configuration of the power receiving side 104 of the system 100. It will be appreciated, however, that the arrangements shown in FIGS. 2A and 2B are merely examples, and one of skill in the art will understand that one or both layouts can be varied in other embodiments of the present technology, while still maintaining the desired object detection and acoustic location functionality. In some embodiments, for example, the acoustic locator system 140 may be contained in a separate housing in communication with the laser detection system 130.

In the embodiment illustrated in FIG. 2A, the components associated with the power transmission side 102 of the optical power transmission system 100 are contained in a common housing 150. In particular, the housing 150 includes the optical power transmitter 112 positioned to deliver laser energy through an exit point 113. In one embodiment, the exit point 113 is comprised of a collimator configured to focus the high-power laser beam 114 (FIG. 1A) such that it propagates with constant or near constant width toward the power receiving element 120 (FIG. 2B). Such an arrangement is expected to help simplify operation of the laser detection system 130 described herein and promote efficient power transfer. As illustrated, the housing 150 can also include an array of guard beam emitters 132 and an array of light detectors 134 positioned proximate the exit point 113. In other embodiments, however, the housing 150 may only include a single guard beam emitter 132 positioned proximate or adjacent the exit point 113. In the illustrated embodiment, the guard beam emitters 132 and light detectors 134 are particularly arranged about and circumferentially set away from the exit point 113 by at least a predetermined distance X—the distance an object would have to travel after disrupting the guard beam path(s) 136a and 136b (FIG. 1A) before interrupting the power supply path—the path of the high-power laser beam 114 (FIG. 1A).

As discussed above, this distance X is selected according to the delay time necessary to interrupted/cut off delivery of the high-power laser beam 114 when a human or object inadvertently enters the beam path. As will be appreciated, a larger distance X provides more time for the laser detection system 130 to detect an obstruction and interrupt/cut off the high-power laser beam 114. In one embodiment, for example, the distance X is selected according to the maximum speed a human body can move multiplied by the trigger delay time in cutting off power to the high-power laser beam 114. By offsetting the features of the laser detection system 130 from the exit point 113 for the high-power laser beam 114 by the predetermined distance X, it is expected that, during operation, the system 100 will prevent or reduce inadvertent exposure of human tissue to the high-power laser beam 114.

The partially schematic diagram of the power receiving element 120 in FIG. 2B illustrates an example of an array of retroreflectors 116 positioned proximate or adjacent the receiving cell. In this embodiment, the retroreflectors 116 are arranged about and circumferentially offset from the receiving cell 122 by a predetermined distance Y. The predetermined distance Y is also selected according to the delay time necessary to interrupt/cut off delivery of the high-power laser beam 114 before a human or object inadvertently enters the beam path. Thus, as will be described in greater detail below with reference to FIGS. 3A and 3B, the arrangement of the retroreflectors 116 is consistent, at least in part, with the arrangement of the guard beam emitters 132 of the laser detection system 130. Further, in some embodiments, the predetermined distance X and predetermined distance Y are equal or approximately equal.

It will also be appreciated that the disclosed arrangement is only an example of one possible configuration, and the array of retroreflectors 116 may have a different arrangement and/or different number of retroreflectors 116. For example, the number of retroreflectors 116 and the border shape they trace around the high-power laser beam 114 can be varied according to various design considerations without departing from the laser detection functionality disclosed herein.

Referring back to FIG. 2A, the acoustic locator system 140 can also be located in/on the housing 150. The acoustic locator system 140 can include, for example, acoustic detection elements 142 positioned on the housing 150 and configured to listen for acoustic emissions 144 emitted by an acoustic emission element 143 housed on or in the power receiving element 120 (FIG. 2B). In one embodiment, the acoustic detection elements 142 may be positioned apart from each other as far as possible on the housing 150 to maximize the difference in arrival time of the acoustic emissions 144 at each acoustic detection element 142. Further details regarding the acoustic locator system 140 are described below with reference to FIG. 4.

Figure 3A:
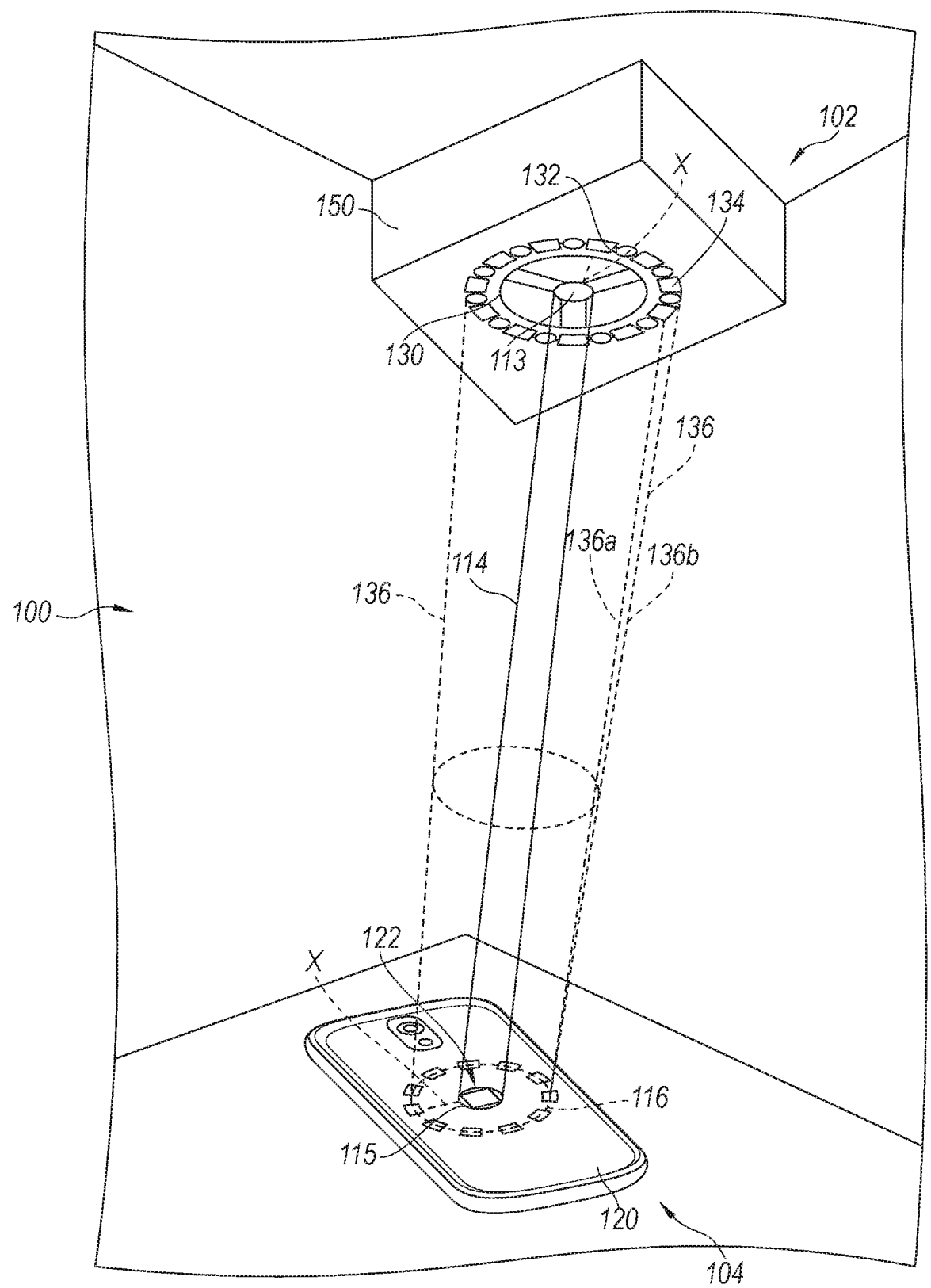
FIG. 3A is an isometric view of an optical power transmission system with a guard beam detection system configured in accordance with the present technology, and in which the path of the guard beams is unobstructed.
Figure 3B:
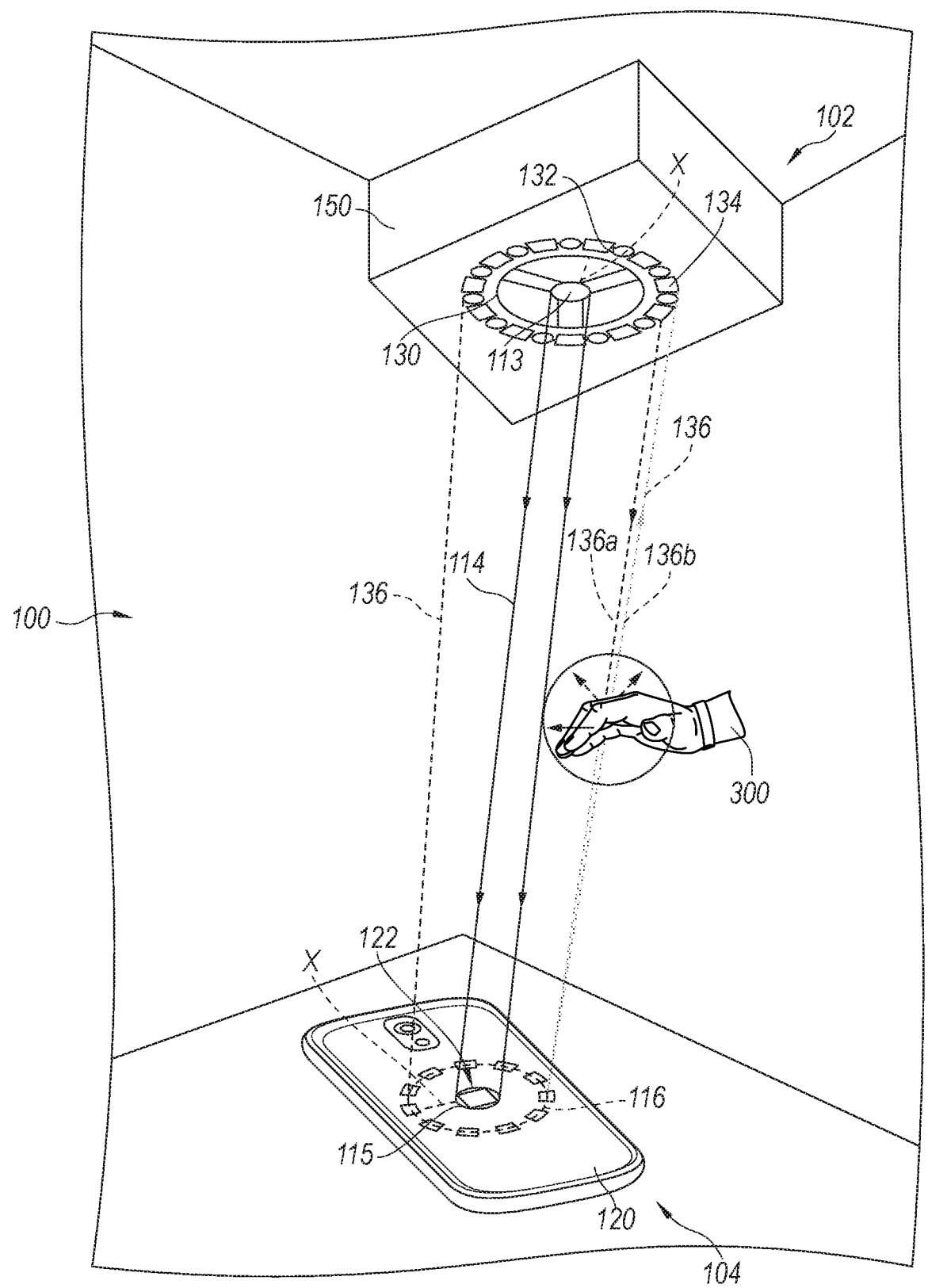
FIG. 3B is an isometric view of the system of FIG. 3A where the path of the guard beams is obstructed by an object.
Figure 3C:
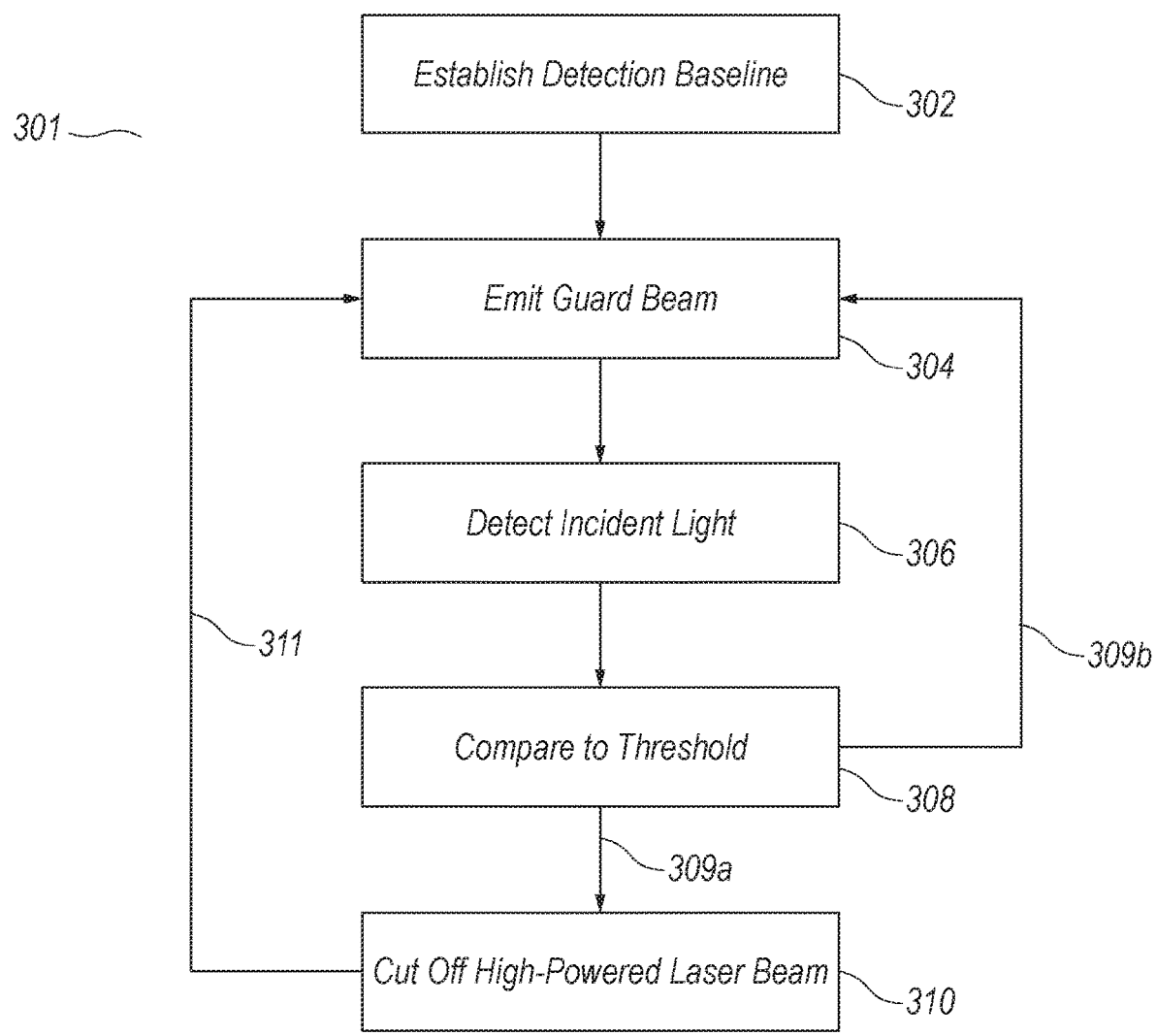
FIG. 3C is a flow diagram of the operation of the laser detection system of FIGS. 3A and 3B.

FIGS. 3A-3C illustrate operation of the laser detection system 130 in accordance with an embodiment of the present technology. More specifically, FIG. 3A is an isometric view of the system 100 when no object is present and/or inbound for the laser detection system 130 to detect; while FIG. 3B is isometric view of the system 100 when an external object 300 is present and/or inbound. As discussed below, the laser detection system 130 is configured to ensure that delivery of the high-power laser beam 114 is interrupted/cut off before the object 300 is unintentionally exposed to the beam 114.

Referring first to FIGS. 3A and 3B, the power receiving side 104 of the system 100 includes a power receiving cell circumferentially surrounded by an array of retroreflectors 116; and the power transmission side 102 contained in housing 150, which includes the optical power transmitter 112 and into a laser detection array 138, comprised of the guard beam emitters 132 and light detectors 134, set off circumferentially from the exit point 113 by the distance X.

In the illustration of the system 100 in FIG. 3A, the optical power transmitter 112 emits the high-power laser beam 114 (a first laser beam) toward the receiving cell 122, while the guard beam emitters 132 emit a curtain of guard beams (second laser beams) toward the array of retroreflectors 116. As shown, when the guard beam paths 136a and 136b are not obstructed, an individual guard beam 136 will take an emitted guard beam path 136a to an individual retroreflector 116, be reflected to a reflected guard beam path 136b, and then be incident on an individual light detector 134. In preferred embodiments, the guard beam paths 136a and 136b are first established during a calibration 302 step before the high-power laser beam 114 is turned on, then constantly cycled in steps 304, 306, 308, and decision 309a (FIG. 3C) when the guard beam paths 136a and 136b remain unobstructed with the high-power laser beam turned on.

In the embodiment illustrated in FIGS. 3A and 3B, the system 100 is configured such that the guard beam paths 136a and 136b and the path from the optical power transmitter to the receiving cell 122 are coincident. Thus, if the guard beam paths 136a and 136b can be established for each guard beam emitter 132 and light detector 134 partner in the laser detection array 138, the high-power laser beam 114 will be guaranteed to be aimed at the receiving cell 122. This can be accomplished, for example, via arrays with only a single matching geometrical alignment, or array designs with perfectly symmetrical sides (e.g. a circle, square, etc.). In another embodiment, the array of retroreflectors 116 can be configured to partially communicate the type of device will receive the power transmission, such that the laser detection system 130 can communicate with the optical power transmitter 112 to adjust the amount of power being transmitted.

FIG. 3B is an isometric view of the system 100 of FIG. 3A when the laser detection system 130 is obstructed by an object 300. Shown here, object 300 interrupts the emitted guard beam path 136a, the reflected guard beam path 136b, or both, such that eventually the guard beam 136 ceases to be incident on the corresponding light detector 134. This causes a discrete decrease in the light incident on the detector (i.e., a drop equivalent to the light from one guard beam), which in turn causes the laser detection system 130 to interrupt/cut off emission of the high-power laser beam 114. Further details regarding this process are described below with reference to FIG. 3C.

Interrupting/cutting off the high-power laser beam 114 can be accomplished in several ways. In one embodiment, for example, the system 100 can make use of various shutters (such as mechanical shutters, crystal shutters, acousto-optical modulators, electro-optical modulators, etc.) designed to interrupt/cut off the high-power laser beam 114 when an object is detected in accordance with the techniques above, which add a full mechanical stop to the transmission of power. Shutter systems, however, may reduce the laser detection system's response time, reduce power transmitted by the optical power transmitter 112, and/or significantly increase the cost of the system 100. In another embodiment, the laser detection system 130 interrupts/cuts off the high-power laser beam 114 by turning off the power to the optical power transmitter 112 altogether. This can be accomplished, for example, using an interlock system (not shown) configured to switch the power of the optical power transmitter 112 to off as soon as a decrease in incident light from the retroreflectors 116 is detected. This arrangement is expected to provide a fast response time while not requiring expensive equipment.

FIG. 3C is a block diagram of a method 301 for detection and interruption of wireless power delivery using the laser detection system 130 described above or another suitable laser detection system. For purposes of illustration, the following description of method 301 references components identified and described above with reference to FIGS. 3A and 3B. The method 301 begins at block 302 by establishing a predetermined value and calibrating the laser detection system 130 such that the laser detection system 130 knows how much light to expect from the at least one guard beam 136, allowing a discrete drop to be detected if a guard beam path is blocked. This calibration process at block 302 can be done once when the system 100 is originally constructed, every time the power transmission side 102 locates or is directed at the retroreflectors 116, or some subset in between. The method 301 continues at block 304 and a connection is made with the array of retroreflectors 116, and the power transmission side 102 is allowed to be fully powered, emitting both the first laser beam (the high-power laser beam 114) and the second laser beam(s)—the at least one guard beam 136. At detection block 306, the light incident on the light detectors 134 from the retroreflectors 116 (that is, the light from guard beam 136 that has travelled from the guard beam emitter 132 to the retroreflectors 116 and back) is measured by the light detectors 134. At block 308, that measurement is compared to a predetermined value, such as the value set during calibration 302, and the method continues with decision block 409. If there has been a drop in the amount of light expected, the light detectors 134 trigger cut-off decision block 309*a* to interrupt the high-power laser beam 114, resulting in down-state 310. If there has not been a drop, the method 301 continuation to decision block 309*b* and the emission-detection cycle restarts.

In one embodiment, this cycle happens constantly, such that the guard beam emitters 132 constantly emit guard beams 136. When the light detection system 103 measure no drop or zero drop in expected light on the detectors, emission of the high-power laser beam 114 continues (at decision block 309*b*). When there is a drop in the amount of light expected, this leads to cut-off decision block 309*a*, and resulting in the system 100 transforming into a down-state 310. In one embodiment, when the returning light returns to the expected value, indicating an object is no longer near the high-power laser beam's 114 path, the system 100 automatically resumes by looping back to block 304 via restart decision block 311. In other embodiments, the system can require an action from a user in place of restart decision block 311 to resume transmitting power.

Figure 4:
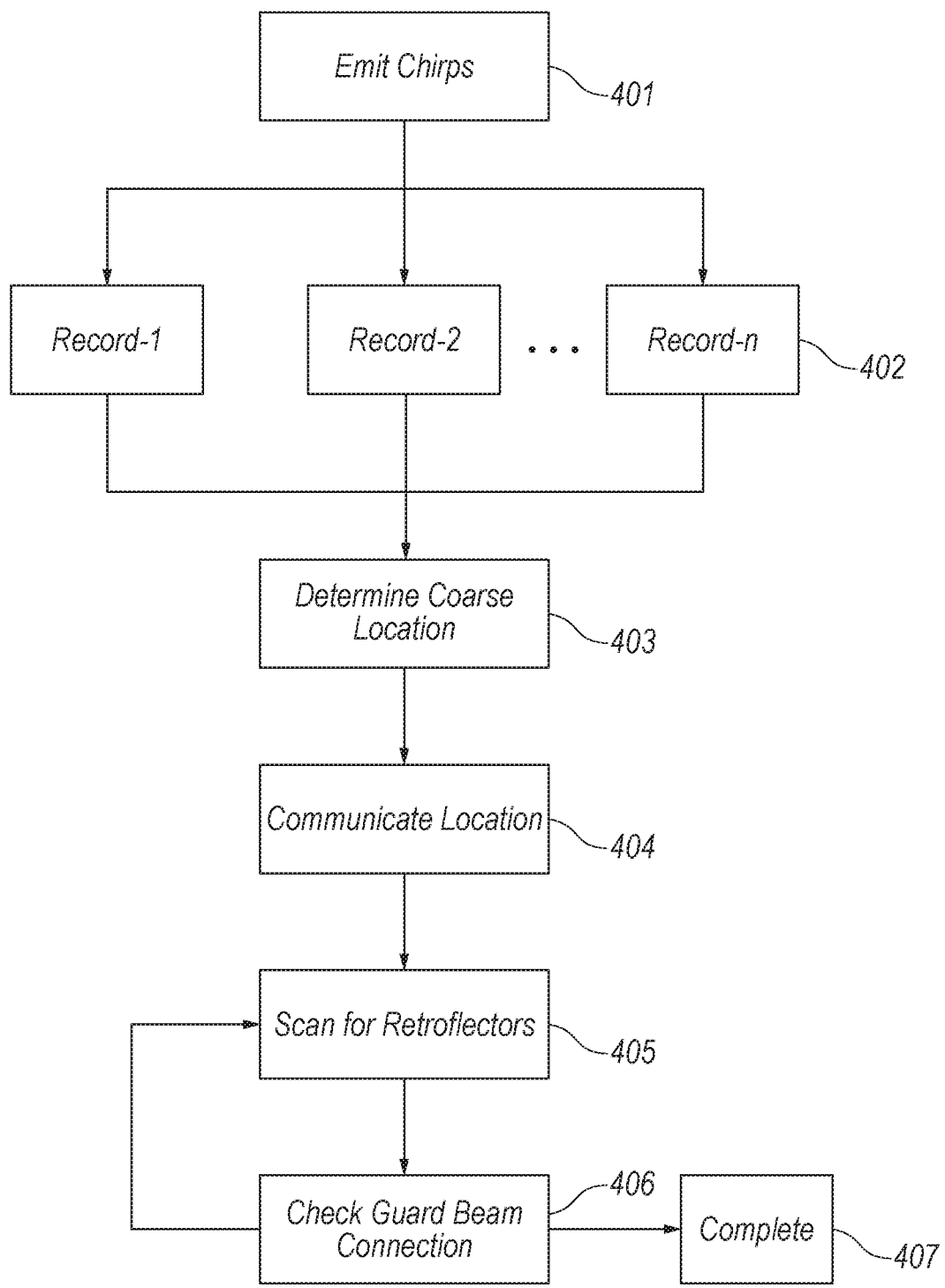
FIG. 4 is a flow diagram of an acoustic location process configured in accordance with various embodiments of the present technology.

FIG. 4 is a flow diagram illustrating another feature of the system 100 that allows the power transmission side 102 (FIG. 1A) to be quickly and accurately aimed at the power receiving side 104 through a combination of acoustic localization techniques and optical scanning. Beginning at block 401 of the process 400 illustrated in FIG. 4 (and also with reference to FIGS. 1A and 1B), the power-storing element 124 broadcasts one or more acoustic emissions 144. In one embodiment, the acoustic emissions 144 are in the human audible range. In another embodiment, however, they are outside the human audible range, as either high frequency emissions or low frequency emissions. At block 402, the acoustic emissions 144 travel from the power-storing element 124 to the acoustic detection elements 142; and the acoustic detection elements 124 record the time of arrival of the acoustic emissions 144 and communicate their time of arrival record to the acoustic localization element 146. By detecting and recording the time of arrival of the acoustic emissions 144 at some number N locations, the acoustic locator system allows the acoustic localization element 146 to perform a multilateralization technique at block 403. Note, multilateralization techniques are well known in the art and not described here to avoid unnecessarily obscuring the description of various embodiments of the present disclosure.

The result of the location step at block 403 is a coarse determination of the location of the power-storing element 124. To determine the precise location of the receiving cell 122, at block 404 the process continues with the acoustic localization element 146 communicating with the laser detection system 130. In one embodiment, the communication can be instructions for the scanning process (block 405), such as specific instructions for the scanning route of the low-powered guard beams. In another embodiment the communication is only the determined location, allowing the laser detection system 130 to determine the scanning route. After the route for the scanning process (block 405) is planned, the scanning process is conducted by the laser detection system 130.

Specifically, the power transmission side 102 is directed or scanned across the coarse location with only the guard beam(s) 136 powered on. While scanning, the laser detection system 130 attempts to establish unobstructed guard beam paths 136*a* and 136*b*. In a preferred embodiment, the guard beam paths 136*a* and 136*b* are coincident with the power supply path—the path of the high-power laser beam 114. Thus, in this embodiment, when the guard beams paths 136*a* and 136*b* are established, the optical power transmitter 112 will be aimed at the power receiving cell 122. As the scanning process (block 405) occurs, the laser detection system 130 runs a check step at block 406 to determine whether the paths have been established, checking whether all light detectors 134 are receiving light from the guard beam 136 such that the guard beam paths 136*a* and 136*b* are established. If the paths have not been established, the scanning process at block 405 continues; if they have been, the laser detection system 130 stops scanning and reaches the completion stage (block 407), at which point the optical power transmitter 112 can be turned on.

In one embodiment, completion stage (block 407) initiates the calibration step (block 302) described above with reference to FIG. 3C. In one embodiment, the check step (block 406) and scanning process (block 405) occur simultaneously or nearly simultaneously to reduce the amount of time the scanning process requires to locate the power receiving element. In another embodiment, the acoustic-based steps at blocks 401-403 are also continuous, allowing for real-time, or near real-time, tracking when the power receiving element 120 is moved during the scanning process or power transmitting process.

Figure 5A:
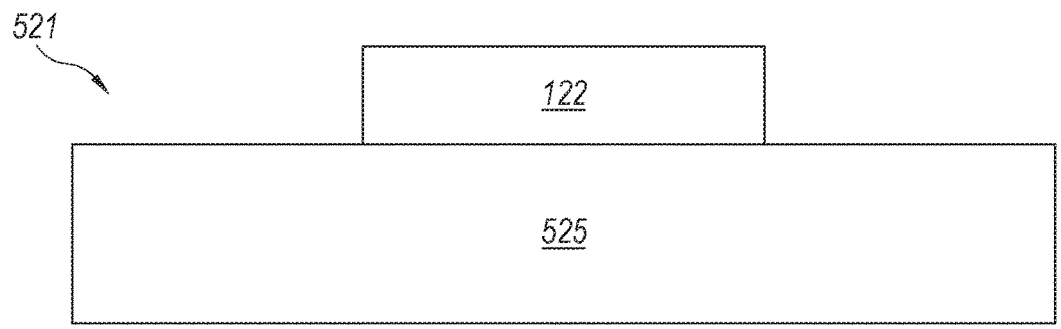
FIG. 5A is block diagram of a power receiving element with a heat dissipation element configured in accordance with various embodiments of the present technology.
Figure 5B:
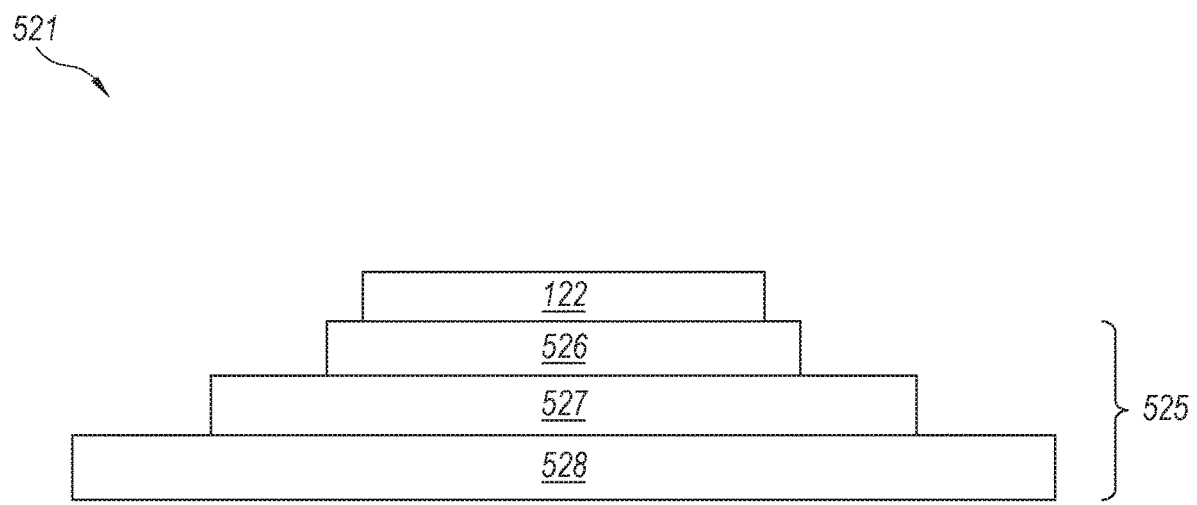
FIG. 5B is a block diagram of a particular embodiment of FIG. 5A, wherein the heat dissipation element is a passive heat dissipator with power generation components.

FIGS. 5A and 5B are block diagrams of a power receiving element 521 with an included heat dissipation system configured in accordance with embodiments of the present technology. Because the system 100 (FIGS. 1A and 1B) makes use of a high-power laser beam 114 incident on a receiving cell 122 that is less than perfectly efficient, the system has the potential to heat up considerably via the excess delivered power. Such heat can affect the performance of the receiving cell 122—sometimes shutting the receiving cell 122 down entirely. Accordingly, the system 100 is expected to benefit from inclusion of a heat dissipation element 525 configured to maintain operable temperatures at the power receiving element 521. It will be appreciated, however, that the heat dissipation element 525 is an optional component that may not be included in all embodiments.

In the embodiment shown in FIG. 5A, the power receiving element 521 comprises the receiving cell 122 and a heat dissipation element 525. The heat dissipation element 525 can be an active cooling system, such as fans or thermoelectric coolers. However, active cooling requires expending power at the power receiving side 104 (FIG. 1A), which can reduce the efficiency of the power transfer. Alternatively, the heat dissipation element 525 can be a passive cooler, such as a heat sink.

FIG. 5B illustrates one embodiment of the power receiving element 521 configured with a passive heat dissipation element 525. In this embodiment, the heat dissipation element 525 comprises a thermal paste layer 526 holding the receiving cell to the heat dissipation element 525, a thermoelectric generator layer 527 to harvest some additional amount of power from the excess heat, and a heatsink 528 to passively dissipate heat not converted to power by the thermoelectric generator layer 527 to allow the receiving cell 722 to continue to operate. In other embodiments, however, the heat dissipation element 525 can also be configured in passive form without the thermoelectric generator layer 526.

Conclusion

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order, alternative embodiments may perform steps in a different order. Furthermore, the various embodiments described herein may also be combined to provide further embodiments.

From the foregoing, it will be appreciated that specific embodiments of the invention have been described herein for purposes of illustration, but that various modifications may be made without deviating from the scope of the invention. Accordingly, the invention is not limited except as by the appended claims.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A system for wireless power transmission, the system comprising:
    a power receiving element positioned to receive wireless power, the power receiving element including—
        a power receiving cell; and
        an acoustic emission element positioned proximate the power receiving cell and configured to generate and broadcast an acoustic signal;
    a power transmission element including an optical power transmitter configured to emit a high-power laser beam toward the power receiving cell,
        wherein the laser beam is a first laser beam, and wherein the power receiving element further includes a retroreflector positioned proximate the power receiving cell; and
        the power transmission element further includes—
            a guard beam emitter configured to emit a second laser beam toward the retroreflector, wherein the second laser beam has a lower power density than the first laser beam; and
            a light detector positioned proximate the optical power transmitter and adapted to detect the reflected second laser beam from the retroreflector;
    an acoustic location component in communication with the power transmission element; and
    an acoustic detection element in communication with the acoustic location component,
    wherein—
        the acoustic detection element is configured to detect the acoustic signal and record a time of arrival for the acoustic signal, and
        the acoustic location component is configured to receive a record of the time of arrival from the acoustic detection element and calculate a location of the acoustic emission element based, at least in part, on the record of the time of arrival,
        the power transmission element is configured to receive the location and scan the second laser beam in a direction of the location to establish a guard beam path, and wherein the guard beam path extends in a first direction from the guard beam emitter to the retroreflector, then a second direction from the retroreflector to the light detector, wherein the second direction is generally opposite to the first direction.

2. The system of claim 1 wherein the system comprises at least three acoustic detection elements.

3. The system of claim 1 wherein the power density of the second laser beam is suitable for human exposure.

4. The system of claim 1 wherein the acoustic location component is configured to communicate the location of the acoustic emission element to the power transmission element.

5. The system of claim 1 wherein the power transmission element is configured such that establishing the guard beam path also establishes a power supply path, and wherein the power supply path extends coincident with the guard beam path.

6. The system of claim 1 wherein:
   the light detector is separated from the power transmitter by a predetermined distance; and
   the retroreflector is separated from the power receiving cell by the predetermined distance.

7. The system of claim 6 wherein the predetermined distance is less than 1.5 cm.

8. The system of claim 1 wherein the power receiving element includes an array of retroreflectors arranged circumferentially about the power receiving cell.

9. The system of claim 8 wherein the power transmission element includes an array of light detectors arranged circumferentially about the optical power transmitter.

10. The system of claim 9 wherein the power transmission element further comprises an array of guard beam emitters arranged circumferentially about the optical power transmitter.

11. The system of claim 1 wherein the power receiving element further comprises a heat dissipation element, and wherein the heat dissipation element is coupled to the power receiving cell and configured to dissipate an excess amount of heat away from the power receiving cell.

* * * * *